United States Patent [19]
Conway et al.

[11] Patent Number: 5,469,331
[45] Date of Patent: Nov. 21, 1995

[54] COOLING SYSTEM FOR MODULAR POWER SUPPLY DEVICE

[76] Inventors: Harry E. Conway, 3837 Paul Mill Rd., Ellicottt City, Md. 21042; Robert A. Bourdelaise, 1113 Autumn Gold Dr., Gambrills, Md. 21054

[21] Appl. No.: 224,466

[22] Filed: Apr. 7, 1994

[51] Int. Cl.⁶ ....................................... H05K 7/20
[52] U.S. Cl. .................. 361/716; 165/80.3; 361/689; 361/735
[58] Field of Search ............................... 174/252; 62/414, 62/418, 259.2; 165/80.3, 80.4, 104.33, 185; 307/150; 363/141; 257/686, 723, 724, 727; 439/62, 64, 68, 73, 267, 197, 485; 361/829, 831, 744, 784, 785, 790, 729, 730, 732, 735, 689, 692, 697, 704, 707, 709–711, 714, 715, 716, 722; 403/374, 409.1; 24/304, 524–526

[56] References Cited

U.S. PATENT DOCUMENTS

| | | | |
|---|---|---|---|
| 3,209,208 | 9/1965 | Francis | 361/716 |
| 3,340,439 | 9/1967 | Henschen | 361/790 |
| 3,904,933 | 9/1975 | Davis | 361/704 |
| 4,186,422 | 1/1980 | Laemer | 361/388 |
| 4,819,713 | 4/1989 | Weisman | 165/1 |
| 5,181,167 | 1/1993 | Davidson | 361/385 |
| 5,251,099 | 10/1993 | Goss | 361/721 |

*Primary Examiner*—Gerald P. Tolin

[57] ABSTRACT

A high density electric power supply device formed by stacked circuit modules including top, bottom and intermediate modules, each of the modules having electrical contact elements retained in engagement with complementing contact elements on an adjacent one of the stacked modules under a force having a direction to press the top and bottom modules against the intermediate modules. Each of at least the intermediate modules have supply and return ports parallel to the direction of the aforementioned force and at least some of the modules having a passageway for circulation of cooling fluid between the supply and return ports therein. An elastic seal circumscribes each of said supply and return ports on at least the intermediate modules for maintaining a continuous fluid-tight passageway through the supply and return ports among the stacked circuit modules, the elastic seals being maintained under compression by the compressing force.

4 Claims, 3 Drawing Sheets

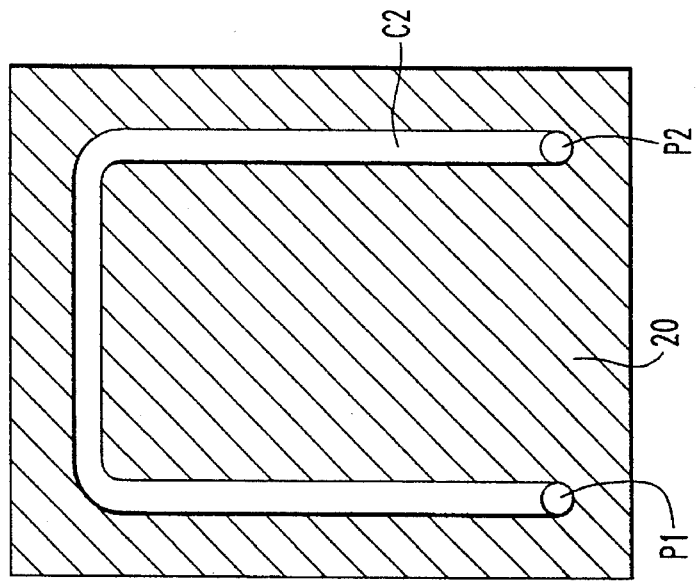
*FIG.5*
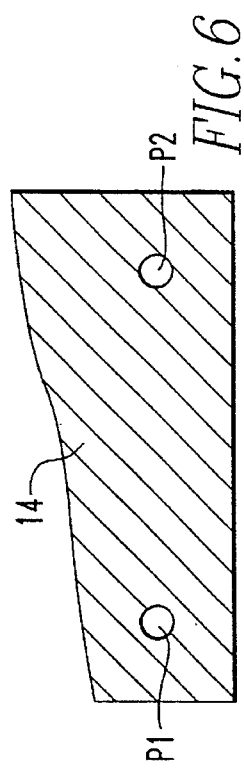
*FIG.6*
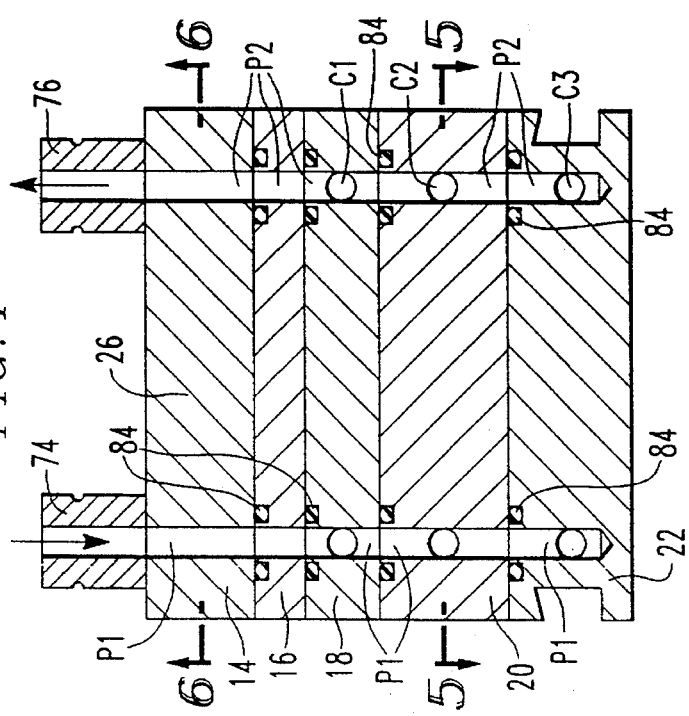
*FIG.4*
*FIG.7*

COOLING SYSTEM FOR MODULAR POWER SUPPLY DEVICE

BACKGROUND OF THE INVENTION

The present invention relates to high density power supply devices, and, more particularly, to a coolant circulating system for such power devices.

For commercial applications such as electric propulsion and alternating current supplies, as well as for many military applications, high density power supply devices have been developed to meet a required combination of reduced size and high current supply capacity. For example, such power supply devices have been produced with a capacity of 8000 Watts, a supply current of 730 Amps and a volume of eighty cubic inches e.g. 4"×4"×5").

Typically, high density power supply devices of this type require use of stacked, layer-like modules interconnected by solder free contact assemblies or "button boards." Such contact assemblies must be retained in engagement by a compressive force applied in a direction normal to the mutually facing surfaces of the stacked modules. The individual modules are constructed of circuit card assemblies supported on opposite sides of a plate-like heat sink of heat conductive material and having internal passageways through which a liquid coolant is circulated to remove excessive heat during operation of the device.

In prior designs of such power supply devices, the coolant passageways in the respective modules were arranged in fluid communication with external coolant supply and return passages in a manifold located on one exterior side of the device. The manifold extended across the common end faces of all modules and was sealed by a gasket located between the manifold and the module end faces. To effect a sealing pressure against the gasket, the manifold was drawn against the gasket by bolts or the like extending into the material of the heat sinks of the modules. As a result, problems have occurred with the connection of the coolant supply and return manifold to the modules interfering with the compressive force by which the button boards establish electrical contact between the respective modules.

SUMMARY OF THE INVENTION

The present invention is, therefore, directed to a coolant circulating system for stacked module, high density, power supply devices by which the problems associated with prior such devices are substantially avoided.

The advantages and purpose of the invention will be set forth in part in the description which follows, and in part will be obvious from the description, or may be learned by practice of the invention. The purpose and advantages of the invention will be realized and attained by means of the elements and combinations particularly pointed out in the appended claims.

To achieve the advantages and in accordance with the purpose of the invention, as embodied and broadly described herein, the invention comprises a high density electric power supply device including at least two stacked circuit modules having mutually facing surface formations, each of the circuit modules having electrical contact elements on at least one of the surface formations thereof, and passageways for a cooling fluid. The electrical contact elements on one of the modules are retained in engagement with the contact elements on another of the modules under a force applied in a direction normal to the surface formations. Fluid coupling means are provided for connecting and sealing the passageways of the respective modules under that same force.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an exemplary embodiment of the invention and together with the description, serves to explain the principles of the invention. In drawings.

FIG. 4 is a cross-section on line 4—4 of FIG. 2;

FIG. 5 is a cross-section on line 5—5 of FIG. 3;

FIG. 6 is a cross-section of line 6—6 of FIG. 3; and

FIG. 7 is an enlarged fragmentary cross-section showing a fluid seal embodiment of the invention.

DESCRIPTION OF THE PREFERRED EMBODIMENT

Reference will now be made in detail to the present preferred embodiments of the invention, an example of which is illustrated in the accompanying drawings. Wherever possible, the same reference numbers will be used throughout the drawings to refer to the same or like parts.

In accordance with the present invention, a high density electric power supply device includes at least two, preferably a larger plurality of, stacked circuit modules interconnected electrically by complementing contact elements presented on mutually facing surfaces of the respective modules. The contact elements of adjacent modules are retained in engagement under a compressive force applied normal to the mutually facing surfaces so that when a plurality of modules are stacked to provide top, bottom and intermediate modules, the top and bottom modules are pressed against the intermediate modules.

Figure 1:
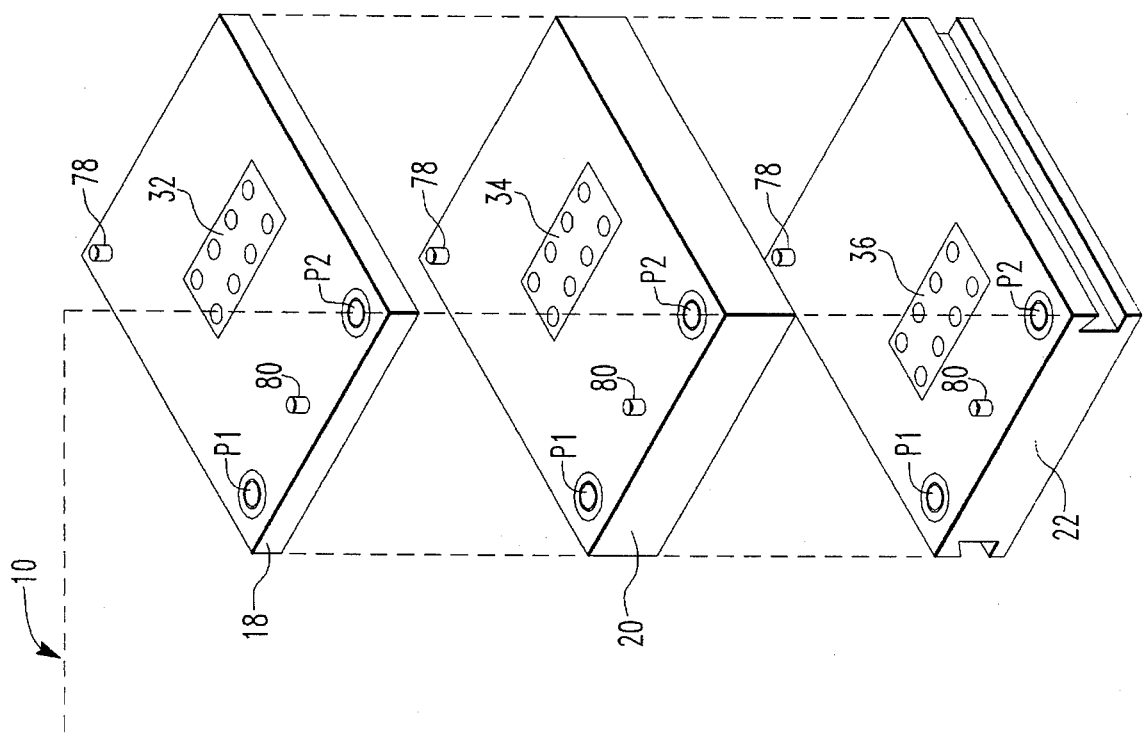
FIG. 1 is an exploded perspective view illustrating the several modules included in the power supply device of the invention.
Figure 1:
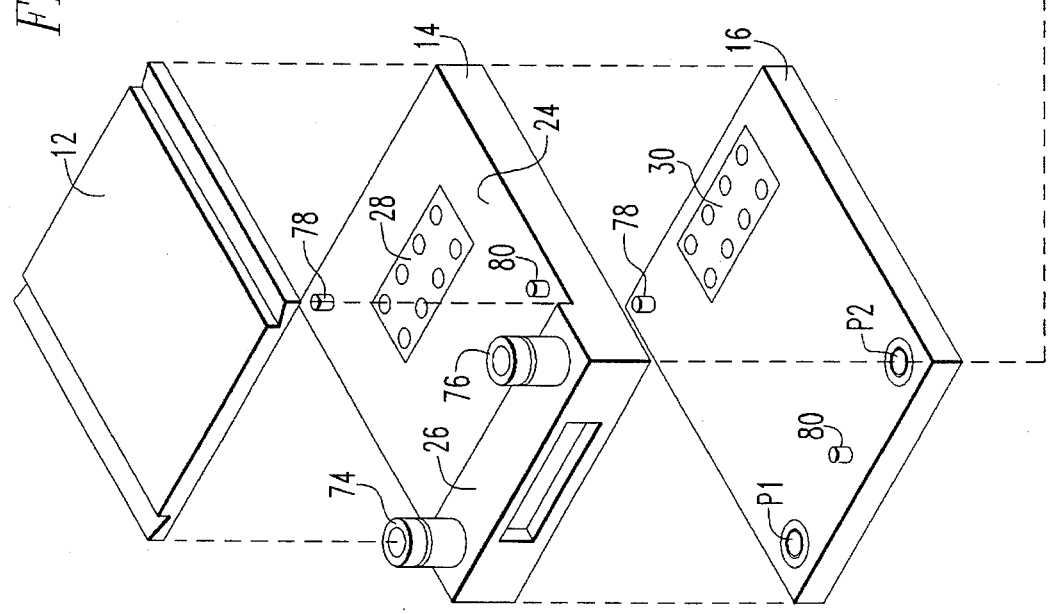
Figure 2:
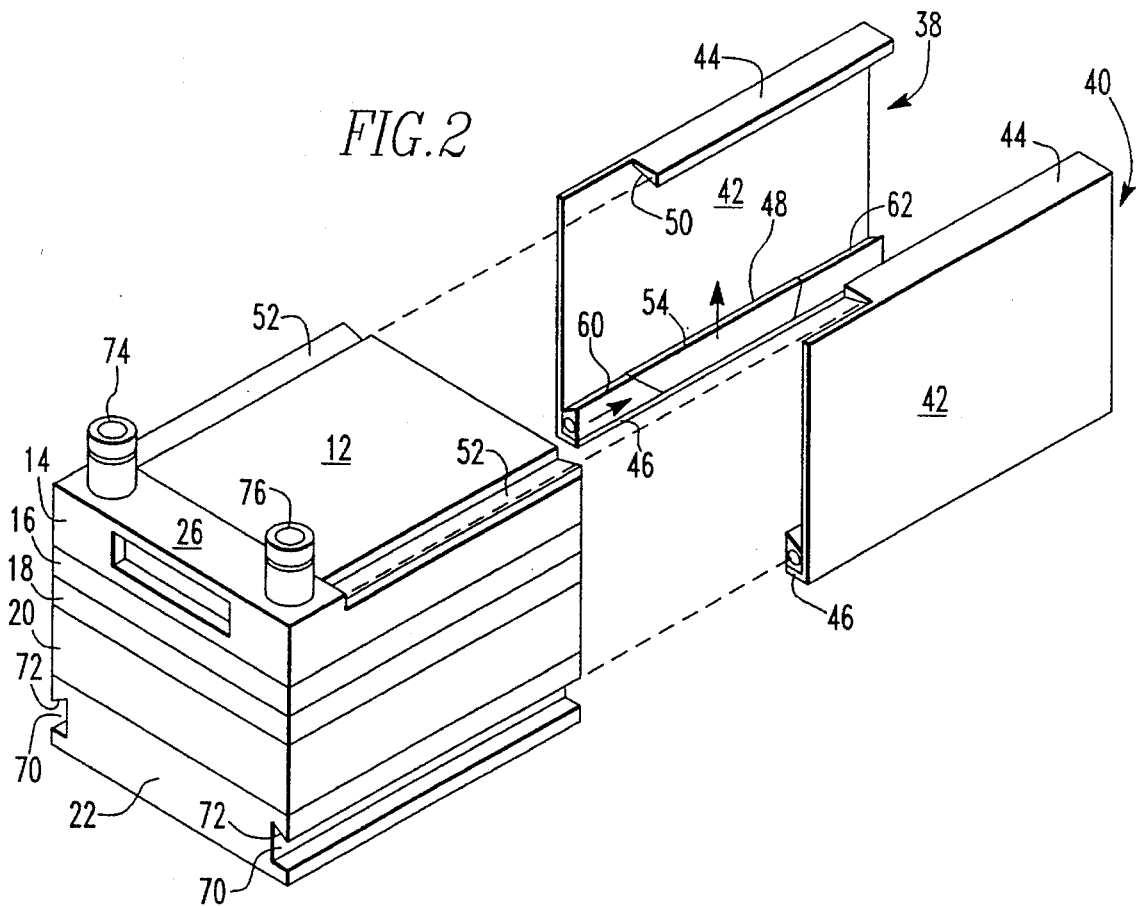
FIG. 2 is a partially exploded perspective view showing the manner in which the modules are retained in a stack.

As embodied herein, and as shown in FIGS. 1, 2 and 4 of the drawings, a power supply device 10 includes six plate like modules to provide a control module 12, an input filter 14, an inverter 16, a resonant tank 18, a transformer/rectifier module 20 and an output filter 22. As shown the modules 12–22 are rectangular in shape and, with the exception of the control module 12, have common exterior width and length dimensions, for example, 4 inches and 5 inches, respectively. The length of the control module 12 is shorter than the other modules to fit into a stepped depression 24 behind a terminal boss portion 26 on the input filter module 14. Also, the thickness of the respective modules vary depending on requirements for size of the functional electric and cooling components contained in each module.

Electrical connections to the exterior of the assembled power supply device, though not shown in the drawings, are made at a terminal recess at the front of the input filter module 14. Electrical connections between the modules are made by complementing, solder free contact assemblies or "button boards" on mutually facing surfaces of the modules. In FIG. 1, the button board contacts on one (i.e. the top) surface of each of the intermediate modules 14–20 and on the bottom module 22, are designated respectively by the reference numerals 28, 30, 32, 34, and 36. Although not illustrated because of the perspective illustration of FIG. 1, the bottom surfaces of the top module 12 and the intermediate modules 14–20 are provided with similar button board contacts at locations to complement the positions of the contact assemblies illustrated.

Figure 3:
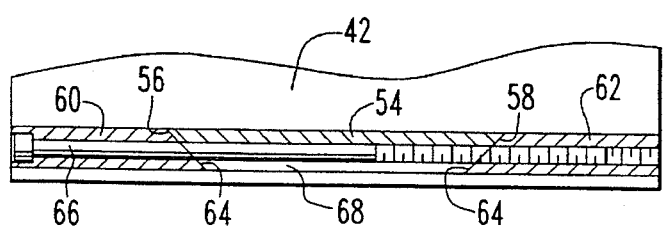
FIG. 3 is a fragmentary cross-section of the stack compressing device shown in FIG. 2.

Electrical connection of the complementing contact assemblies on mutually facing surfaces of the modules requires a compressive force acting transversely to the surface formations including the contact assemblies or vertically in the illustrated embodiment. As shown in FIGS. 2 and 3, a pair of plate brackets 38 and 40 are provided to develop and maintain such a compressive force. Each of the plate brackets 38 and 40 is a mirror image of the other. As such, each bracket includes a web portion 42, a top flange 44, a bottom flange 46 and a wedge assembly 48. The top flanges have an inclined bottom surface 50 and are of a length to engage the full length of the top module 12 in inclined shoulder recesses 52 along each side of the top module 12.

The components of the wedge assembly 48 are shown most clearly in FIGS. 2 and 3 to include a central output block 54, having downwardly facing inclined end surfaces 56 and 58, and a pair of input blocks 60 and 62, each having an upwardly facing inclined surface 64. The input blocks are connected by a threaded bolt 66 for drawing the input blocks toward each other. The central output block 54 has a bottom slot 68 along the length thereof to enable vertical movement thereof without interference by the bolt 66. Thus, by rotating the bolt 66, the input blocks 60 and 62 will be drawn against the central output block 54 to wedge it upwardly.

In the illustrated embodiment, the bottom module 22 is provided with grooves 70 along the length of each side to receive the wedge assemblies on the brackets 38 and 40. It is to be noted that the upper edge 72 of each of the grooves is inclined to provide the grooves with an under-cut at least along the top edges. The top edges of the blocks 54, 60 and 62 in each of the wedge assemblies 48 is inclined to complement this shape of the grooves 70. Moveover, the inclined tops of the wedge assemblies 48 and the bottom surfaces 50 of the flanges 44 converge inwardly toward the modules 12 and 22 to effect pulling the brackets 38 and 40 inwardly when the wedge assemblies 48 are operated to develop a compressive force on the modules.

In accordance with the invention, at least some of the stacked modules of the power supply device include fluid passageways for circulating a coolant between feed and-return ports provided in the respective modules. The feed and return ports are aligned in a direction parallel to the direction of compressive force applied to maintain electrical contact engagement between the modules. Compressive seals circumscribe at least one end of each of the ports. The seals are thus compressed by the force maintaining electrical connection and combine to form continuous feed and return manifolds for the modules through which coolant is circulated.

In the illustrated embodiment, and as shown most clearly in FIGS. 1 and 4–7 of the drawings, each of the modules 14–22 is provided at one end with a pair of ports which, for the purpose of avoiding redundant reference characters, are designated respectively by the common reference characters P1 and P2 for all modules although the ports in some of the modules differ from those in others. The ports P1 and P2 extend vertically in each of the modules 14–22 or parallel to the direction of force applied by the brackets 38 and 40 with the associated wedging assemblies 48. In addition, the ports in the individual modules are aligned to provide single inlet and outlet manifolds terminating at their upper ends in upstanding nipples 74 and 76 fixed at the boss formation 26 of the input filter module 14. The nipples 74 and 76 are in practice connected to coolant hoses or conduits by which a liquid coolant may be circulated into the nipple 74 and out from the nipple 76. To insure alignment of the ports P1 and P2 in the respective modules 14–22, as well as to insure alignment of the contact assemblies 28–36 on the respective modules, the mutually facing surfaces of the respective modules are provided with a pair of dowel pins 78 and 80 (FIG. 1) on the top surface of each module engageable with corresponding holes (not shown) on the underside of the modules.

As may be seen in FIGS. 4–6, each of the modules 18, 20 and 22 in the illustrated embodiments is provided with a coolant circulating passageways C1, C2 and C3, respectively. In FIG. 5, the coolant passageways are shown to extend in a generally U-shaped configuration throughout the center of the module. In this respect, the modules, particularly those which include a coolant passageway, are formed with a central core of a metal heat sink in which the passageways C1–C3 are formed. The circuit components (not shown) for the electrical function of the module are supported on opposite sides of the central heat sink.

Others of the modules which do not include coolant passageways, such as the modules 14 and 16 in the illustrated embodiment, include the ports P1 and P2 maintaining continuity of the circulating coolant passageway to and from those modules in which passageways C1–C3 are provided. Also, all ports in the top and intermediate modules are through ports, whereas in the bottom module 22 the ports P1 and P2 terminate short of the bottom surface of that module.

To insure fluid sealing between the ports P1 and P2 of the respective modules, an elastic seal is provided about at least one surface of each module. As shown in FIGS. 4 and 7, the top surfaces of each of the modules 16–22 are provided with an annular groove 82 (FIG. 7) spaced outwardly of the ports P1, P2. A compressible seal, such as an O-ring 84 is seated in the annular groove 82 and is dimensioned relative thereto to project upwardly from the upper surface of the module. Thus, when the modules are assembled, the respective O-rings 84 will be compressed to effect a fluid-tight seal between the ports P1, P2 of the respective modules.

In the assembly of the modules to provide the power supply device 10, it will be appreciated from the preceding description that each module is stacked on a lower module with the pins 78 and 80 aligned with holes (not shown) in the undersurface of an upper module. When assembled to the configuration shown in FIG. 2, the brackets 38 and 40 are advanced in the grooves 70 of the bottom module and over the ledge 52 of the top module. Thereafter, the bolts 66 of the wedge assemblies 48 are tightened to develop a compressive force by which the top and bottom modules are compressed against the intermediate modules. In this relatively simple operation, the complete module is assembled with the contact assemblies firmly engaged and with the fluid passageways, defined in part by the ports P1 and P2, completely sealed.

It will be apparent to those skilled in the art that other modifications and variations can be made in the power supply device of the present invention and in the construction of this device without departing from the spirit or scope of the invention. For example, in the illustrated embodiment, the top and bottom surfaces of the respective modules on which the contact assemblies and fluid port seals are mounted lie in a single plane. It is contemplated that the top and bottom surfaces may be stepped so that the seals 84 and contact assemblies on each module lie in different parallel planes. It is necessary only that the portions of the module surfaces which face each other be complementary in that the seals 84 are compressed simultaneously with pressurized engagement of the contacts 28–36.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A high density electric power supply device comprising:

a plurality of stacked circuit modules including top, bottom and intermediate modules;

2. The power supply device of claim 1, wherein the compressive seal comprises an O-ring seated in an annular groove in at least one of the adjacent stacked circuit modules.

each of said plurality of stacked circuit modules having electrical contact elements retained in engagement with complementing contact elements on an adjacent one of said plurality of stacked circuit modules under a force having a direction to press said top and bottom modules against said intermediate modules;

each of at least said intermediate modules having supply and return ports parallel to the direction of said force;

at least some of said plurality of stacked circuit modules each having a passageway for circulation of cooling fluid between the supply and return ports therein;

a compressive seal circumscribing each of said supply and return ports on at least said intermediate modules for maintaining a continuous fluid-tight passageway through the supply and return ports among the stacked circuit modules, the compressive seals being maintained under compression by said force; and retaining brackets extending between the top and bottom modules on at least two opposite sides of the stacked modules to maintain said force.

3. The power supply device of claim 1, wherein the retaining brackets include a wedge assembly to develop and maintain said force.

4. The power supply device of claim 3, wherein the wedge assembly includes a central output block, a pair of spaced input blocks, and a threaded bolt for drawing the input blocks against the output block to develop said force.

* * * * *